United States Patent [19]

McGaffigan

[11] Patent Number: 5,093,545
[45] Date of Patent: Mar. 3, 1992

[54] METHOD, SYSTEM AND COMPOSITION FOR SOLDERING BY INDUCTION HEATING

[75] Inventor: Thomas H. McGaffigan, Half Moon Bay, Calif.

[73] Assignee: Metcal, Inc., Menlo Park, Calif.

[21] Appl. No.: 464,919

[22] Filed: Jan. 16, 1990

Related U.S. Application Data

[63] Continuation-in-part of Ser. No. 242,208, Sep. 9, 1988, abandoned, and a continuation-in-part of Ser. No. 404,621, Sep. 8, 1989.

[51] Int. Cl.$^5$ .................... H05B 6/10; B23K 1/00
[52] U.S. Cl. .................... 219/9.5; 219/10.43; 219/85.11; 219/85.2; 228/56.3
[58] Field of Search .............. 219/85.11, 85.1, 85.2, 219/85.21, 10.41, 10.43, 9.5, 10.53, 10.57, 10.75; 228/56.3

[56] References Cited

U.S. PATENT DOCUMENTS

| | | | |
|---|---|---|---|
| 1,975,436 | 10/1934 | Sorrel et al. | 219/13 |
| 1,975,437 | 10/1934 | Sorrel et al. | 219/13 |
| 2,393,541 | 1/1946 | Kohler | 20/0.5 |
| 3,391,846 | 7/1968 | White | 229/17 |
| 3,548,140 | 12/1970 | O'Neill | 219/10.53 |
| 3,900,153 | 8/1975 | Beerwerth et al. | 228/56 |
| 3,902,940 | 9/1975 | Heller, Jr. et al. | 156/79 |
| 3,923,580 | 12/1975 | Leatherman | 219/10.53 |
| 4,035,547 | 7/1977 | Heller, Jr. et al. | 219/10.53 |
| 4,107,506 | 8/1978 | Pelegri | 219/85 A |
| 4,256,945 | 3/1981 | Carter et al. | 219/10.75 |
| 4,290,195 | 9/1981 | Rippere | 29/837 |
| 4,327,265 | 4/1982 | Edinger et al. | 219/10.41 |
| 4,431,891 | 2/1984 | Forstner et al. | 219/9.5 |
| 4,642,442 | 2/1987 | Mullane et al. | 219/10.41 |
| 4,659,912 | 4/1987 | Derbyshire | 219/535 |
| 4,665,309 | 5/1987 | Derbyshire | 219/538 |
| 4,695,713 | 9/1987 | Krumme | 219/553 |
| 4,749,833 | 6/1988 | Novorsky et al. | 219/10.43 |
| 4,771,151 | 9/1988 | Pursell | 219/10.53 |
| 4,788,404 | 11/1988 | Kent | 219/85.1 |
| 4,789,767 | 12/1988 | Doljack | 219/9.5 |
| 4,795,870 | 1/1989 | Krumme et al. | 219/9.5 |
| 4,852,252 | 8/1989 | Ayer | 29/860 |
| 4,914,267 | 4/1990 | Derbyshire | 219/85.1 |
| 4,983,804 | 1/1991 | Chan et al. | 219/85.11 |
| 4,987,283 | 1/1991 | Beinhaur et al. | 219/85.11 |

OTHER PUBLICATIONS

Lee, E. W., *Magnetism, An Introductory Survey*, pp. 201-204 (1970).
Smit et al., *Ferrites*, pp. 155-160 (1959).

Primary Examiner—Philip H. Leung
Attorney, Agent, or Firm—Burns, Doane, Swecker & Mathis

[57] ABSTRACT

This invention provides a method for soldering using induction heating, which is accomplished by the use of lossy heating particles in or on the solder. The method of this invention provides direct heating of the solder itself through induction heating of the magnetic particles in an alternating magnetic field. The magnetic particles useful in this invention can be ferromagnetic particles or ferrimagnetic particles, preferably ferrites, which have a Curie temperature at least equal to the flow temperature of the solder. Selection of the magnetic lossy heating particles with the appropriate Curie temperature for the system in which the particles are being used provides a system in which the temperature is self-regulating when the alternating magnetic field is applied. This self-regulation feature prevents overheating of the solder in the articles being soldered. The invention also discloses the selection of particles with surface properties whereby the particles can either be wetted by the solder and remain in the solder when the solder flows or it can be nonwettable by the solder whereby the particles separate from the solder when the solder flows. The surface properties can also be provided by coatings on the particles. This invention also discloses solder compositions comprising solder and lossy heating particles which produce the desired heat in an alternating magnetic field. The invention also provides systems and assemblies for the use of the above method and composition.

63 Claims, 2 Drawing Sheets

METHOD, SYSTEM AND COMPOSITION FOR SOLDERING BY INDUCTION HEATING

RELATED APPLICATIONS

This application is a continuation-in-part of U.S. Ser. No. 07/242,208 filed Sept. 9, 1988, now abandoned, and is a continuation-in-part of U.S. Ser. No. 07/404,621 filed Sept. 8, 1989.

FIELD OF THE INVENTION

This invention relates to solder compositions adapted for use in alternating magnetic fields.

BACKGROUND OF THE INVENTION

The use of ferrite particles to produce heating in alternating magnetic fields is known in the art. As disclosed in U.S. Pat. No. 3,391,846 to White, and U.S. Pat. No. 3,902,940 to Heller et al., ferrite particles have been used to produce heat in various systems to cause chemical reactions, melt materials, evaporate solvents, produce gases, and for other purposes.

PCT International Publication WO84/02098 (Application No. PCT/US83/01851) corresponding to U.S. Pat. No. 4,914,267 of Derbyshire discloses the use of ferromagnetic materials having the desired Curie temperature in electrically conductive layers to provide auto-regulated heating to the Curie temperature of the material upon application of an alternating current to the conductive layer of ferromagnetic material. The power applied to the ferromagnetic layer is in the form of an alternating current source which produces skin effect or eddy current heating in the continuous ferromagnetic layer. As the ferromagnetic layer reaches the Curie temperature, the permeability of the layer drops and the skin depth increases, thereby spreading the current through the wider area of the ferromagnetic layer until the Curie temperature is achieved throughout and the desired heating is achieved.

In my copending applications referred to above and incorporated herein by reference, I disclose the use of magnetic particles in combination with heat-recoverable articles in an alternating magnetic field systems to effect heating and recovery of the articles. In some instances therein, the heat from the article melts solder preforms present in those articles.

It is also known that soldering can be accomplished by induction heating in a magnetic field. In such induction heating, the magnetic field inductively heats the article or device being soldered and that heat is transferred from the article or device to the solder to flow the solder. For example, see U.S. Pat. No. 4,107,506 to Pelegri.

It is an object of this invention to provide an improved method for soldering which provides for efficient and specific heating of the solder itself.

It is a further object of this invention to provide a self-regulating system for heating to flow solder and thereby reduce the risk of overheating the solder or the device or article being soldered.

Other objects and advantages of this invention will be apparent to one skilled in the art.

SUMMARY OF THE INVENTION

I have determined that it is desirable in many instances to provide direct heat to solder materials through the use of an alternating magnetic field. Consequently, this invention provides a composition comprising in combination a solder material and lossy heating particles which have a Curie temperature at least equal to the flow temperature of the solder and which are sufficiently lossy to produce sufficient heating for flowing the solder when subjected to an alternating magnetic field. In one aspect, the lossy heating particles are ferrimagnetic particles such as ferrites, and in another aspect, the particles are ferromagnetic particles.

In a preferred aspect of this invention, the lossy heating particles are dispersed in the solder and in another preferred aspect, the solder is in the form of a solder paste having the lossy heating particles dispersed in the paste. In another preferred aspect, the composition further comprises nonlossy particles which have high permeability and are capable of providing and maintaining magnetic circuit coupling while the lossy heating particles are at or near their Curie temperature. In another preferred aspect, the lossy heating particles are present as a layer of particles in the solder or solder paste or as a layer on the surface of the solder or solder paste.

In another aspect, this invention is an article suitable for connection to another article having deposited thereon at the point of connection a solder composition comprising in combination a solder material and lossy heating particles which are ferrimagnetic and have a Curie temperature at least equal to the flow temperature of the solder or are ferromagnetic and have a Curie temperature in the range from about the flow temperature of the solder to about 300° C. above the flow temperature of the solder and wherein the lossy heating particles are sufficiently lossy to produce sufficient heating for flowing the solder when subjected to an alternating magnetic field.

In another aspect, this invention is a method for soldering an article comprising:

placing on the article a composition comprising in combination a solder material and lossy heating particles which have a Curie temperature at least equal to the flow temperature of the solder and which are sufficiently lossy to produce sufficient heating for flowing the solder when subjected to an alternating magnetic field; and subjecting the article and the composition to an alternating magnetic field to cause the lossy heating particles to heat the solder to its flow temperature.

In another aspect, this invention comprises a system for soldering an article comprising:

an article suitable for connecting to another article having deposited thereon at the point of connection a solder composition comprising in combination a solder material and lossy heating particles which have a Curie temperature at least equal to the flow temperature of the solder and which are sufficiently lossy to produce sufficient heating for flowing the solder when subjected to an alternating magnetic field;

an induction coil adapted to produce the magnetic field; and a power supply being adapted to provide power to the induction coil as alternating current at a preselected frequency effective for heating said particles.

In another aspect, this invention comprises an assembly comprising:

an induction coil adapted to produce a magnetic field;

an article suitable for connection to another article having deposited thereon at the point of connection a solder composition comprising in combination a solder material and lossy heating particles which have a Curie temperature at least equal to the flow temperature of the solder and which are sufficiently lossy to produce sufficient heating for flowing the solder when subjected to an alternating magnetic field positioned in said alternating magnetic field; and a power supply connected to said induction coil, said power supply being adapted to provide power to the induction coil as alternating current at a preselected frequency effective for heating said particles.

DESCRIPTION OF THE INVENTION

This invention involves the phenomenon that lossy magnetic particles, such as lossy ferrites, produce heat when subjected to an alternating magnetic field and the fact that the magnetic permeability of such particles declines as the Curie temperature is approached. When the Curie temperature is achieved, permeability of the ferrite particles drops significantly, thereby providing a mechanism by which the particles are self-regulating at a maximum temperature equal to the Curie temperature and subjected to an alternating magnetic field. This phenomenon is utilized in various aspects of my copending applications, U.S. Ser. No. 07/404,621, filed Sept. 8, 1989, and U.S. Ser No. 07/465,933, filed of even date with this application, and disclosures of these copending applications are incorporated herein by reference.

In various applications, solder has been heated indirectly as a part of other devices and articles heated by various means. In my copending application Ser. No. 07/404,621, heat-recoverable devices are heated in alternating magnetic fields, which heat-recoverable devices may include solder components, or preforms therein, which melt when the heat-recoverable article is heated.

I have determined that it is desirable to provide heat directly to the solder by using lossy heating particles in or on the solder itself. Heating solder according to this invention provides certain advantages of precision in the control of heating and flowing the solder, as well as economic advantages in heating only the solder and the components being soldered instead of surrounding materials. If desired, the surrounding materials can be independently heated as provided in my copending applications or the surrounding materials can be heated from the lossy heating particles present in the solder according to this invention.

An important aspect of the compositions, methods and articles of this invention is they are self-regulating due to the Curie temperature of the magnetic lossy heating particles. Thus, the solder and solder paste compositions of this invention can be used in an alternating magnetic field so that the solder and the articles on or in which the solder is used are protected from over-heating. The lossy heating particles can be selected as disclosed herein with appropriate Curie temperatures to melt the solder and prevent excessive heat. This feature of the present invention can continue to provide the desired benefit, such as where a device is to be resoldered or repaired. So long as the lossy heating particles are present in or on the solder, it can again be melted or reflowed by placing it in an alternating magnetic field and the solder/lossy heating particles will continue to be self-regulating, thereby preventing excessive heating during soldering or resoldering. This provides protection for heat sensitive electronic devices or components present.

The term "solder" as used herein is not limited to mixtures of lead, but relates to any conductive material which is liquified by heat and which binds or unites when cooled. Given appropriate heating temperatures, brazing can be accomplished in much the same ways as with solder. Aluminum is another example of a particularly good solder material, since it can be made to wet other metals and forms a strong bond when cooled. In addition to the conventional lead-tin, lead-tin-indium and similar solders, other materials useful as solder or in solder compositions and alloys include bismuth, antimony, zinc, silver, brass, gold, and the like, which are soldering or brazing materials.

As used herein, the term "solder paste" includes conventional solder paste compositions and equivalents wherein the solder material is in the form of particles dispersed in or carried by a paste component which can be a flux, resin, grease, or the like, which is effective in keeping the solder particles dispersed an is effective in evaporating or flowing away from the solder particles when the solder is melted or liquified to form the desired bond between the solder and the substrate to which it is being applied.

The term "lossy heating particles" as used herein means any particle having particular properties which result in the particles being capable of generating sufficient heat for purposes of this invention when subjected to an alternating magnetic field having a specified frequency. As further described hereinbelow, any particle having these properties and being useful in the present invention is within the scope of this definition. As pointed out herein, there has been inconsistent and/or confusing terminology used in association with particles which respond to magnetic fields. While not being bound by particular terminology, the lossy heating particles useful in this invention generally fall into the two categories of materials known as ferromagnetic materials and ferrimagnetic materials.

In general, the ferrimagnetic materials, such as ferrites, are preferred because they are usually nonconductive particles and because they produce heat by hysteresis losses when subjected to an alternating magnetic field. Therefore, ferrimagnetic particles will produce heating by hysteresis losses in the appropriate alternating magnetic field, essentially regardless of whether the particle size is large or small.

Also useful in this invention, and preferred in some applications, are the ferromagnetic particles which are usually electrically conductive. Ferromagnetic particles will produce heating dominated by hysteresis losses if the particle size is small enough. However, since ferromagnetic particles are conductive, larger particles will produce significant heating by eddy current losses. When the compositions of this invention comprise ferromagnetic particles, it is preferred to select such particles which have a Curie temperature in the range between the flow temperature of the solder and no more than about 300° C. above the flow temperature of the solder, more preferably no more than about 200° C. and more preferably no more than about 150° C.

It is generally preferred in the practice of this invention to provide heating by hysteresis losses because the particle size can be much smaller for effective hysteresis loss heating than with effective eddy current heating, i.e., for hysteresis loss heating, the smaller particle size enables more uniform heating of the article and does not degrade the mechanical properties of the material, because the smaller particles can be more dispersed than larger particles. The more dispersed, smaller particles thereby usually provide more efficient heating. However, the particle size is to be at least one magnetic domain in size in order to provide the necessary hysteresis losses, i.e., the particles are preferably as small as practical but are multi-domain particles.

The heating produced by the lossy heating particles useful in the present invention can be either provided by or can be enhanced by coating the particles with an electrically-resistive coating. As will be recognized by one skilled in the art, particles that are not lossy because they do not exhibit hysteresis losses can be converted to lossy heating particles for use in this invention by placing such a coating on the particles. The coating produces eddy current losses associated with the surface effect of the coated particles. At the same time, particles which are lossy due to hysteresis losses can be enhanced in their effectiveness for some applications by such coatings, thereby providing lossy particles which produce heating both by hysteresis losses and by eddy current losses.

It is known that ferrites can possess any range of Curie temperatures by compounding them with zinc, manganese, cobalt, nickel, lithium, iron, or copper, as disclosed in two publications: "The Characteristics of Ferrite Cores with Low Curie Temperature and Their Application" by Murkami, *IEEE Transactions on Magnetics*, June 1965, page 96, etc., and Ferrites by Smit and Wijn, John Wiley & Son, 1959, page 156, etc. Therefore, selection of lossy heating particles to provide desired Curie temperatures will be apparent to one skilled in the art.

In the past, there has been some inconsistent usage of terminology with respect to ferromagnetic materials. For example, compare the nomenclature used in White, U.S. Pat. No. 3,319,846, and used in Lee, *Magnetism, An Introductory Survey*, Dover Publications, Inc., New York, 1970, FIG. 44, at page 203. The preferred nomenclature is believed to be that of Lee and is primarily used herein. See also Brailsford, *Magnetic Materials*, Methuen & Co. Ltd., London, 1960.

The term "ferromagnetic" has frequently been used to refer to magnetic materials generically, regardless of their particular properties. Thus, ferrites have usually been referred to as being "ferromagnetic" or included in the general group of ferromagnetic materials. However, for purposes of this invention, it is preferred to use the terminology shown in FIG. 44 of Lee, referred to above, wherein the magnetic particles are classified in two groups, ferromagnetic and ferrimagnetic. The ferromagnetic particles are usually considered to be electrically conductive materials which have various magnetic properties. The ferrimagnetic materials are usually considered to be electrically nonconductive materials which also have various magnetic properties. Ferrites are usually considered to be electrically nonconductive materials and are thus in the class of ferrimagnetic materials. Both ferromagnetic materials and ferrimagnetic materials can be low-loss, or nonlossy, type of materials, which means they do not have significant energy loss or heat produced when subjected to an electric potential or magnetic field. These nonlossy type of magnetic materials are the kind used in various electric equipment components, such as ferrite cores for coils, where no or minimum energy loss/heat production is desired. However, both these materials can also be the high-loss, or lossy, type of materials, which means they will have significant energy loss and heat production when subjected to an electric potential or magnetic field. It is this class of lossy or highly lossy ferromagnetic and ferrimagnetic materials which are useful as lossy heating particles in the present invention.

Regardless of the labels or terminology for magnetic particles, the magnetic particles useful as and included within the scope of the term "lossy heating particles" for the present invention need merely to have the following properties: (1) having the desired Curie temperature for auto-regulation of the temperature when subjected to an appropriate alternating magnetic field, and (2) being sufficiently lossy, either by hysteresis losses, by eddy current losses, or both, in order to produce the desired heat when subjected to the alternating magnetic field. These particles are referred to as being "highly lossy." While the size of the particles is not particularly important in the present invention, it is desirable to use smaller particles since they can be dispersed more uniformly in the material, thus heating more efficiently and uniformly. As recognized by one skilled in the art, the size of the particle should be no smaller than one magnetic domain, i.e., the particles should be multi-domain size particles.

Similarly, regardless of labels or terminology, the magnetic particles useful as and included within the scope of the term "nonlossy particles" for the present invention need merely to have the following properties: (1) having a sufficiently high magnetic permeability to couple with the magnetic circuit selected for use, (2) being sufficiently nonlossy so that the particles do not produce a significant or an interfering amount of heat in the system and the particular magnetic field frequency and intensity selected for use, and (3) have a sufficiently high Curie temperature s that the particles do not significantly decrease in magnetic permeability in the temperature ranges desired for operation. These particles are referred to as "nonlossy high permeability particles."

The magnetic particles such as ferrites used in the system of the present invention can have a number of characteristics which perform differently in the various embodiments of the solder system of the present invention. The magnetic particles selected for use in this invention will be selected based on their particular characteristics and properties, depending on how the particles are desired to perform in the solder system of this invention and depending on whether the particles are initially dispersed in the solder, dispersed in the solder paste, or whether the particles form a layer on the surface or through the interior of the solder or solder paste. As will be recognized by one skilled in the art following the teachings contained herein, the particular lossy heating particles can be selected based on these characteristics and properties in view of how the particles are intended to be used.

The magnetic particles themselves can be conductive or nonconductive. In some applications, it may be desired to use conductive particles, particularly where they remain in the solder and the solder is to form a conductive contact or joint. Nonconductive particles may be preferred when the particles are not to remain in the solder after heating or where the solder is not forming an electrical circuit and electrical conductivity is not an important consideration.

Another characteristic to be considered and utilized in this invention is whether the surface of the lossy heating particles is wettable or not wettable by the solder when it melts and flows. If the surface of the particles is wettable by the solder, the particles can be selected so that they will remain in the solder when the solder flows and then cools. When the surface of the particles is not wettable by the molten solder, the particles will generally separate from the solder and appear on the surface of the molten solder. If a particular desired magnetic particle is not wettable by the molten solder, it can be made wettable by coating the magnetic particle with a compatible coating, such as a thin metal coating which is wettable by the solder. Whether the surface of the particle is wettable or nonwettable by the molten solder is also an important consideration in some instances where the magnetic particle produces heat from eddy current losses on the surface of the particle. Such eddy current losses are generally induced from the skin effect or surface layer which produces the eddy current losses. If the surface of such a particle is wetted by the molten solder, the skin effect or surface eddy current losses may be lost when the solder wets the surface of the particle which, in effect, increases the thickness of conductive layer at the surface of the particle. If such a particular magnetic particle exhibiting surface eddy current losses is desired and it is not desired to lose the heating effect when the solder is melted or reflowed, the surface of the particle can be protected by a thin coating of a nonconductive material, such as a polymer, which would protect the particle surface eddy current path from interference from the molten solder. On the other hand, there may be systems designed according to the present invention where it is desired to have the molten solder essentially shut off the surface eddy current heating losses, for example, where the interior of the particle itself will continue to produce heating from hysteresis losses or, for example, in a mixture of particles where the skin effect or surface eddy current heating losses on part of the particles assist in rapid heating of the solder and continued heating can be provided by other particles in the mixture which continue to heat from hysteresis losses while the solder is molten. In yet other embodiments of the present invention, it may be desired to have particles which are wettable by the solder or particles which have coatings thereon which are wettable by the solder in order to produce the finished solder connection or joint which has enhanced strength and better appearance. As mentioned above, another consideration is particle size, particularly smaller particle size in particles which heat by hysteresis losses. In such small, hysteresis-type lossy heating particles, the heat generation will continue to be provided whether or not the surface of such particles is wetted by the molten solder.

Another consideration in the selection of particles is the relative density of the particles compared to the density of the solder. For example, the magnetic particles can be of a lower density than the solder, in which event they can be designed to rise to the surface of the solder when the solder is reflowed and is in the liquid state. Particles which are dispersed in a solder paste, and are not wettable by the solder, can be floated to the surface and separated from the solder to a degree that the magnetic particles can then be removed from the solder after the solder has reflowed and solidified. In other embodiments, the magnetic particles can have a higher density so that they do not tend to separate from the solder and if the magnetic particles are wettable by the solder, for example, by being coated with metallic coating which is wettable by the solder, the magnetic particles will stay in the solder while the solder is reflowed and allowed to solidify. This enables heating at a later time by again placing the solder in an appropriate alternating magnetic field.

As is apparent to one skilled in the art from the above, the present invention enables the selection of solder and particle materials to satisfy a wide range of requirements and produce desired results in a number of different applications and configurations. From the following description and illustration of particular embodiments of this invention, it will further be apparent to one skilled in the art that the methods, compositions and systems of this invention can be adapted to and designed into numerous articles and in-use applications.

In certain embodiments of the present invention, it may be useful to provide means for heating the surface of the substrate to be soldered. This can be accomplished by providing a layer of the magnetic particles on the surface of the solder which is placed in contact with the substrate so that the magnetic particles heat the substrate on which the solder body is placed at the same time that the magnetic particles heat and melt the solder onto the substrate surface.

In other embodiments of this invention, the solder composition comprising lossy heating particles can be used in various combinations and configurations. For example, the solder compositions of this invention can be placed in heat-shrinkable tubing to form heat-recoverable solder connectors, whereby the solder compositions of this invention provide the heat in the alternating magnetic field to not only melt the solder but to also provide at least a portion of the heat to recover the heat-recoverable sleeve or tubing. Of course, the heat-recoverable sleeve or tubing can also contain, or have a coating thereon, of magnetic particles in accordance with my copending applications which would separately provide heating, for example, at a different Curie temperature, self-regulated level, for recovery of the sleeve and/or to provide heating to other elements in such a heat-recoverable connector assembly, such as hot melt adhesives, sealers, and the like.

Figure 1:
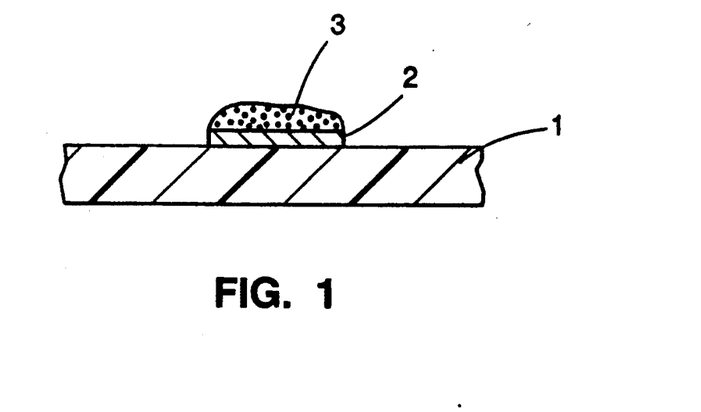
FIG. 1 illustrates in cross section an article according to the present invention having a solder composition deposited thereon wherein the lossy heating particles are dispersed in the solder.

FIG. 1 illustrates in cross section an article according to the present invention where article 1 has electrical interconnect pad 2 on which a quantity of solder composition 3 has been deposited. Solder composition 3 contains lossy heating particles dispersed in the solder material. In such an embodiment, the solder can be either solid solder having the particles dispersed therein or can be a solder paste with the lossy heating particles dispersed in the solder paste. Similarly, but not illustrated in the drawing, solder material 3 can be conventional solder or conventional solder paste having a layer of lossy heating particles on the surface thereof. In a similar embodiment, the lossy heating particles can be present as a layer on interconnect pad 2 with the solder deposited on top of the lossy heating particle layer.

Figure 2A:
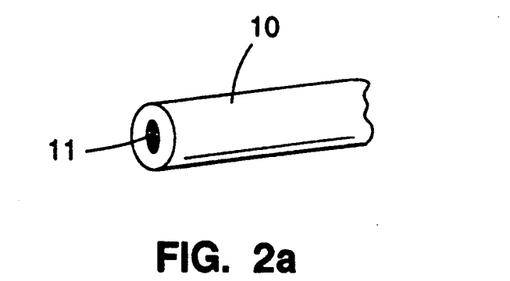
FIGS. 2a, 2b, and 2c illustrate in cross section solder articles according to this invention having lossy heating particles contained therein.
Figure 2B:
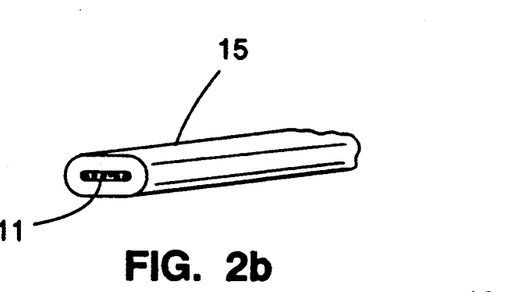
Figure 2C:
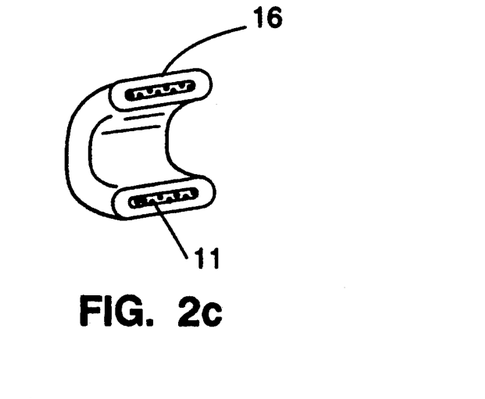

FIGS. 2a, 2b, and 2c illustrate an example of embodiments of the present invention. FIG. 2a illustrates a cored solder wire 10 which contains, in the core space thereof, lossy heating particles 11 according to the present invention. FIG. 2b illustrates a solder ribbon according to this invention which is the solder wire of FIG. 2a, which has been flattened to form ribbon 15, which contains the lossy heating particles 11 in the interior core thereof. FIG. 2c illustrates a solder preform which has been formed from ribbon 15 of FIG. 2b. Solder preform 16 likewise contains the lossy heating particles 11 on the interior portion thereof. Solder preform 16 can be used, for example, in an electrical connector or in a heat-shrink tubing connector. As discussed herein, the solder wire, ribbon or preform, as illustrated, can be heated and reflowed in an alternating magnetic field wherein the heat is generated from the lossy heating particles 11 present in those articles.

Figure 3:
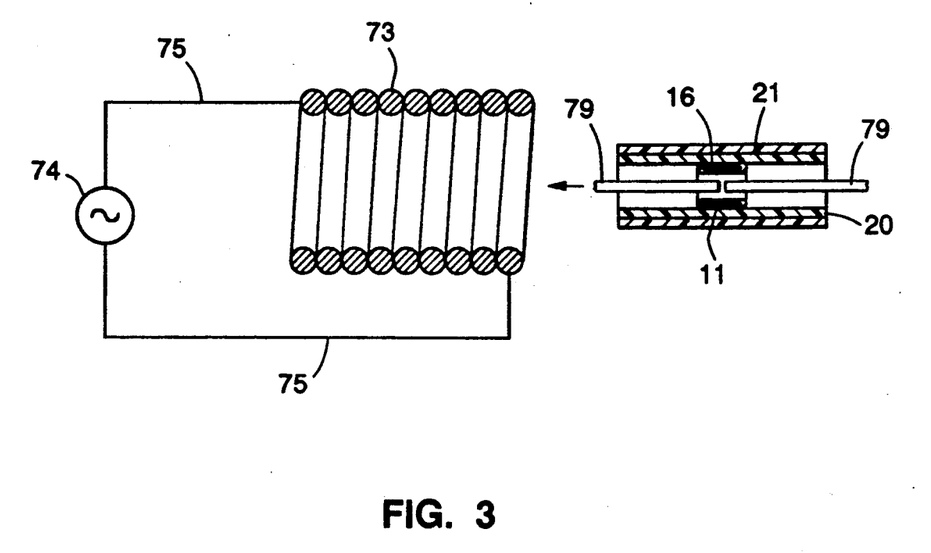
FIG. 3 illustrates in cross section a system according to this invention.

FIG. 3 illustrates an embodiment of a system according to this invention which is a heat-shrink connector having a layer 21 of lossy heating particles on the outside and solder preform 16 of FIG. 2c on the inside. Heat-shrink tube 20 contains solder insert 16 and is adapted for connecting wires 79 when tube 14 recovers and solder insert 16 melts. Solder insert 16 contains a core 11 of lossy heating particles. This connector is adapted for placement into induction coil 73 (shown in section view), which is connected to alternating current power supply 74 by leads 75. Preferably, the power supply is a constant current power supply as known in the art, for example, see U.S. Pat. No. 4,789,767 to Doljack, incorporated herein by reference. The induction coil, which is adapted for receiving article 20, generates an alternating magnetic field in the area of connector 20, causing the lossy heating particles in solder preform 16 to generate heat, thereby heating and melting the solder. Simultaneously or sequentially, the external heating heating particles in layer 21 also generate heat to shrink-tube connector 20.

Figure 4:
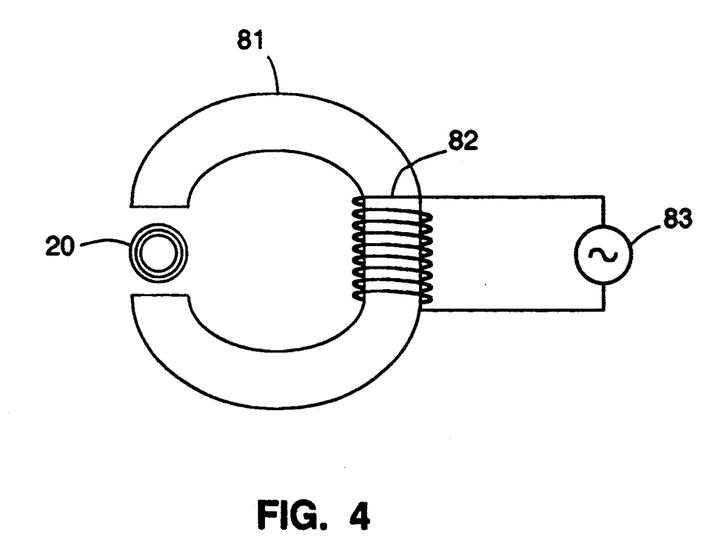
FIG. 4 illustrates in cross section an assembly according to this invention.

FIG. 4 illustrates an embodiment of an assembly according to this invention and illustrates another embodiment for generating the alternating magnetic field for use in this invention, split toroid core 81 generates a magnetic field in the area adapted for receiving article 20. Coil 82 is connected to alternating current power supply 83 to produce the desired alternating magnetic field. In view of the above general description and the description of particular embodiments, it will be apparent to one skilled in the art following these teachings that numerous variations and embodiments of this invention can be adapted for various desired uses.

The following examples are set forth to illustrate particular preferred embodiments of the system of the present invention. It is to be understood that the above description and the following examples are set forth to enable one skilled in the art to practice this invention and the scope of this invention is defined by the claims appended hereto.

In the following examples, the power supply used was an RFG30 model available from Metcal, Inc., Menlo Park, Calif. The butterfly type coil was made of 0.025 hml wire with 4 turns on each wing of the coil. A matching network was used as is known in the art.

EXAMPLE I

In this example, a ferrite particle TT1-1500, available from Trans-Tech, Inc., Adamstown, Md. having a Curie temperature of 180° C. was mixed 50/50 by volume with a solder paste alloy SN63 available from Kester Solder, Chicago, Ill. A 14-turn solenoid coil was used with the above power supply. The solder paste-ferrite particle mixture was placed in a 0.100 inch diameter Kapton tube. The filled tube was placed into the solenoid coil, the power rose to approximately 30 watts and, almost immediately, melted solder was expelled from the end of the tube due to the solder flux boiling within the tube and forcing the solder out of the tube.

EXAMPLE II

In this example, a butterfly coil (as described above) was placed against a fresh lump of the 50/50 Example I solder paste-ferrite particle mixture on an aluminum surface. The power increased to approximately 20 watts and, upon a visual examination, molten nodules of solder could be seen. The solder nodules formed in the mixture did not wet the ferrite particles. The ferrite particles floated to the top of the solder.

EXAMPLE III

The 50/50 solder paste-ferrite particle mixture of Example I was placed in a 3/16-inch diameter polyolefin heat-shrink tube having a recovery temperature of 120° C. A striped wire was inserted in each end of the tube and when the tube containing the solder and wires was inserted into a 0.200-inch inside diameter, 15-turn, solenoid-type coil. The power increased to approximately 30 watts and the solder melted and the tube shrank in about 5 seconds, terminating the wires together.

What is claimed is:

1. A method for soldering an article comprising:
   placing on the article a composition comprising in combination a solder material and lossy heating particles in thermal contact with the solder material which particles have a Curie temperature at least equal to the flow temperature of the solder and which are sufficiently lossy to produce sufficient heating for flowing the solder when subjected to an alternating magnetic field, wherein the lossy heating particles (a) comprise ferrimagnetic particles or (b) comprise ferromagnetic particles and nonlossy particles having high permeability and being capable of providing magnetic circuit coupling through the ferromagnetic lossy heating particles; and
   subjecting the article and the composition to an alternating magnetic field to cause the lossy heating particles to heat the solder to its flow temperature.

2. A method according to claim 1 wherein the lossy heating particles are dispersed in the solder material.

3. A method according to claim 1 wherein the solder material comprises a solder paste.

4. A method according to claim 2 wherein the solder material comprises solder paste.

5. A method according to claim 1 wherein the lossy heating particles comprise a layer of particles.

6. A method according to claim 5 wherein the layer of lossy heating particles is on the surface of the solder material.

7. A method according to claim 6 wherein the lossy heating particles comprise ferrite particles.

8. A method according to claim 1 wherein the lossy heating particles comprise ferrite particles.

9. A method according to claim 8 wherein the lossy heating particles comprise ferrite particles having a conductive coating on the surface thereof.

10. A method according to claim 1 wherein the lossy heating particles are such that the surface thereof is wetted by the solder when the solder flows.

11. A method according to claim 1 wherein the lossy heating particles are such that the surface thereof is not wetted by the solder when the solder flows.

12. A method according to claim 1 wherein the ferrimagnetic particles further comprise nonlossy particles having a high permeability and being capable of providing magnetic circuit coupling through the ferrimagnetic lossy heating particles.

13. A method according to claim 1 wherein the article comprises a heat recoverable member and wherein the heat produced by the lossy heating particles at least in part causes the member to recover.

14. A solder composition comprising in combination a solder material and ferrimagnetic lossy heating particles which have a Curie temperature at least equal to the flow temperature of the solder and which are sufficiently lossy to produce sufficient heating for flowing the solder when subjected to an alternating magnetic field.

15. A composition according to claim 14 wherein the lossy heating particles are dispersed in the solder.

16. A composition according to claim 15 wherein the solder comprises solder paste.

17. A composition according to claim 14 wherein the solder comprises solder paste.

18. A composition according to claim 14 wherein the lossy heating particles comprise a layer of particles.

19. A composition according to claim 14 wherein the lossy heating particles comprise ferrite particles.

20. A composition according to claim 14 wherein the lossy heating particles comprise a conductive coating on the surface thereof.

21. A composition according to claim 14 comprising nonlossy particles having a high permeability and being capable of providing magnetic circuit coupling when the lossy heating particles are at or near their Curie temperature.

22. A composition according to claim 14 wherein the lossy heating particles are such that the surface thereof is wetted by the solder when the solder flows.

23. A composition according to claim 14 wherein the lossy heating particles are such that the surface thereof is not wetted by the solder when the solder flows.

24. A solder composition comprising in combination (a) a solder material, (b) ferrimagnetic lossy heating particles which have a Curie temperature in the range between about the flow temperature of the solder and up to about 300° C. above the flow temperature of the solder and which are sufficiently lossy to produce sufficient heating for flowing the solder when subjected to an alternating magnetic field and (c) nonlossy particles having a high permeability and being capable of providing magnetic circuit coupling when the ferromagnetic lossy heating particles are at or near their Curie temperature.

25. A composition according to claim 24 wherein the lossy heating particles are dispersed in the solder.

26. A composition according to claim 25 wherein the solder comprises solder paste.

27. A composition according to claim 24 wherein the solder comprises solder paste.

28. A composition according to claim 24 wherein the lossy heating particles comprise a layer of particles.

29. A composition according to claim 24 wherein the lossy heating particles comprise a nonconductive coating on the surface thereof.

30. An article suitable for connection to another article having deposited thereon at the point of connection a solder composition comprising in combination a solder material and lossy heating particles in thermal contact with the solder material which particles have a Curie temperature at least equal to the flow temperature of the solder wherein the lossy heating particles (a) comprise ferrimagnetic particles or (b) comprise ferromagnetic particles and nonlossy particles having a high permeability and being capable of providing magnetic circuit coupling through the ferromagnetic lossy heating particles and wherein the lossy heating particles are sufficiently lossy to produce sufficient heating for flowing the solder when subjected to an alternating magnetic field.

31. An article according to claim 30 comprising a heat recoverable cover thereon adapted for recovering onto the article.

32. An article according to claim 31 wherein the heat recoverable cover comprises a layer of lossy heating particles on a surface thereof.

33. An article according to claim 32 wherein the layer of lossy heating particles is on the inside surface of the heat recoverable cover.

34. An article according to claim 30 wherein the solder composition is on the form of a solder ribbon.

35. An article according to claim 30 wherein the solder composition is in the form of a solder preform.

36. A cored solder wire comprising lossy heating particles in the core thereof wherein the lossy heating particles have a Curie temperature at least equal to the flow temperature of the solder and which are sufficiently lossy to produce sufficient heating for flowing the solder when subjected to an alternating magnetic field wherein the lossy heating particles (a) comprise ferrimagnetic particles or (b) comprise ferromagnetic particles and nonlossy particles having a high permeability and being capable of providing magnetic circuit coupling through the ferromagnetic lossy heating particles.

37. A cored solder wire according to claim 36 comprising a flux in the core.

38. A solder ribbon which comprises the cored solder wire of claim 36 which has been flattened to form a solder ribbon.

39. Solder preforms which comprise segments of the solder ribbon of claim 38 which have been cut and shaped to form a solder preform.

40. An autoregulating system for soldering an article comprising:
an article suitable for connection to another article having deposited thereon at the point of connection a solder composition comprising in combination a solder material and lossy heating particles which have a Curie temperature at least equal to the flow temperature of the solder and which are sufficiently lossy to produce sufficient heating for flowing the solder when subjected to an alternating magnetic field wherein the lossy heating particles (a) comprise ferrimagnetic particles or (b) comprise ferromagnetic particles and nonlossy particles having a high permeability and being capable of providing magnetic circuit coupling through the ferromagnetic lossy heating particles;

an induction coil adapted to produce the magnetic field; and a power supply being adapted to provide power to the induction coil as alternating current at a preselected frequency effective for heating said particles.

41. A system according to claim 40 wherein the power supply comprises a constant current power supply.

42. A system according to claim 40 wherein the lossy heating particles are dispersed in the solder.

43. A system according to claim 42 wherein the solder comprises solder paste.

44. A system according to claim 40 wherein the solder comprises solder paste.

45. A system according to claim 40 wherein the lossy heating particles comprise a layer of particles.

46. A system according to claim 40 wherein the lossy heating particles comprise ferrite particles.

47. A system according to claim 40 wherein the lossy heating particles comprise a conductive coating on the surface thereof.

48. A system according to claim 40 wherein the ferrimagnetic particles further comprise nonlossy particles having a high permeability and being capable of providing magnetic circuit coupling when the ferrimagnetic lossy heating particles are at or near their Curie temperature.

49. A system according to claim 40 wherein the lossy heating particles are such that the surface thereof is wetted by the solder when the solder flows.

50. A system according to claim 40 wherein the lossy heating particles are such that the surface thereof is not wetted by the solder when the solder flows.

51. A system according to claim 40 wherein the article comprises a heat recoverable member which is heated by the lossy heating particles.

52. An assembly comprising:

an induction coil adapted to produce a magnetic field;

an article suitable for connection to another article having deposited thereon at the point of connection a solder composition comprising in combination a solder material and lossy heating particles which have a Curie temperature at least equal to the flow temperature of the solder and which are sufficiently lossy to produce sufficient heating for flowing the solder when subjected to an alternating magnetic field positioned in said alternating magnetic field wherein the lossy heating particles (a) comprise ferrimagnetic particles or (b) comprise ferromagnetic particles and nonlossy particles having a high permeability and being capable of providing magnetic circuit coupling through the ferromagnetic lossy heating particles; and a power supply connected to said induction coil, said power supply being adapted to provide power to the induction coil as alternating current at a preselected frequency effective for heating said particles.

53. An assembly according to claim 52 wherein the power supply comprises a constant current power supply.

54. An assembly according to claim 52 wherein the lossy heating particles are dispersed in the solder.

55. An assembly according to claim 54 wherein the solder comprises solder paste.

56. An assembly according to claim 52 wherein the solder comprises solder paste.

57. An assembly according to claim 52 wherein the lossy heating particles comprise a layer of particles.

58. An assembly according to claim 52 wherein the lossy heating particles comprise ferrite particles.

59. An assembly according to claim 52 wherein the lossy heating particles comprise a conductive coating on the surface thereof.

60. An assembly according to claim 52 wherein the ferrimagnetic particles further comprise nonlossy particles having a high permeability and being capable of providing magnetic circuit coupling when the ferrimagnetic lossy heating particles are at or near their Curie temperature.

61. An assembly according to claim 52 wherein the lossy heating particles are such that the surface thereof is wetted by the solder when the solder flows.

62. An assembly according to claim 52 wherein the lossy heating particles are such that the surface thereof is not wetted by the solder when the solder flows.

63. An assembly according to claim 52 wherein the article comprises a heat recoverable member which is heated by the lossy heating particles.

* * * * *

UNITED STATES PATENT AND TRADEMARK OFFICE
CERTIFICATE OF CORRECTION

PATENT NO. : 5,093,545

DATED : March 3, 1992

INVENTOR(S) : Thomas H. McGaffigan

It is certified that error appears in the above-identified patent and that said Letters Patent is hereby corrected as shown below:

Column 5, line 41, delete "Ferrites" and insert --<u>Ferrites</u>-- therefor.

Column 6, line 48, delete "s" and insert --so-- therefor.

Column 10, line 26, delete "when" and insert --then-- therefor.

Signed and Sealed this

Twenty-second Day of June, 1993

Attest:

MICHAEL K. KIRK

*Attesting Officer*     Acting Commissioner of Patents and Trademarks